(12) United States Patent
Chiang

(10) Patent No.: US 11,466,937 B2
(45) Date of Patent: Oct. 11, 2022

(54) BASIC STRUCTURAL BODY FOR CONSTRUCTING HEAT DISSIPATION DEVICE AND HEAT DISSIPATION DEVICE

(71) Applicant: ASIA VITAL COMPONENTS CO., LTD., New Taipei (TW)

(72) Inventor: Kuei-Feng Chiang, New Taipei (TW)

(73) Assignee: ASIA VITAL COMPONENTS CO., LTD., New Taipei (TW)

( * ) Notice: Subject to any disclaimer, the term of this patent is extended or adjusted under 35 U.S.C. 154(b) by 246 days.

(21) Appl. No.: 16/215,645

(22) Filed: Dec. 11, 2018

(65) Prior Publication Data

US 2019/0186840 A1      Jun. 20, 2019

Related U.S. Application Data

(60) Provisional application No. 62/598,134, filed on Dec. 13, 2017.

(51) Int. Cl.
*F28D 15/04* (2006.01)
*H05K 7/20* (2006.01)
(Continued)

(52) U.S. Cl.
CPC .......... *F28D 15/043* (2013.01); *B23P 15/26* (2013.01); *C23C 18/31* (2013.01); *C23C 24/08* (2013.01); *C25D 1/00* (2013.01); *C25D 7/00* (2013.01); *F28D 15/0233* (2013.01); *F28D 15/0266* (2013.01); *F28D 15/06* (2013.01); *F28F 21/04* (2013.01); *H01L 23/427* (2013.01); *H05K 7/20336* (2013.01); *F28D 15/046* (2013.01);
(Continued)

(58) Field of Classification Search
CPC ....... F28D 15/043; F28D 15/046; C25D 1/00; C25D 7/00; C23C 18/31; C23C 24/08
USPC .................................................. 165/104.26
See application file for complete search history.

(56) References Cited

U.S. PATENT DOCUMENTS 9,835,383 B1     12/2017  Roper et al.
10,096,537 B1 *  10/2018  Chen ............... F28D 15/0233
(Continued)

FOREIGN PATENT DOCUMENTS

CN    1877241 A    12/2006
CN    1901176 A     1/2007
(Continued)

OTHER PUBLICATIONS

Search Report dated Jun. 12, 2019 issued by Taiwan Intellectual Property Office for counterpart application No. 107142119.
(Continued)

*Primary Examiner* — Joel M Attey
(74) *Attorney, Agent, or Firm* — Demian K. Jackson; Jackson IPG PLLC

(57) ABSTRACT

A basic structural body for constructing heat dissipation device and a heat dissipation device are disclosed. The heat dissipation device includes a first basic structural body having a wick structure formed on one side surface thereof; and the first basic structural body and the wick structure are structural bodies formed layer by layer. Two pieces of first basic structural bodies can be correspondingly closed together to construct a heat dissipation device internally defining an airtight chamber. In this manner, the heat dissipation device can be designed in a more flexible manner.

4 Claims, 12 Drawing Sheets

(51) Int. Cl.
    *C25D 1/00*           (2006.01)
    *C23C 18/31*         (2006.01)
    *F28D 15/02*         (2006.01)
    *C25D 7/00*           (2006.01)
    *C23C 24/08*         (2006.01)
    *H01L 23/427*        (2006.01)
    *B23P 15/26*         (2006.01)
    *F28D 15/06*         (2006.01)
    *F28F 21/04*          (2006.01)
    *H01L 23/373*        (2006.01)
    *F28F 21/08*          (2006.01)

(52) U.S. Cl.
    CPC ........... *F28F 21/083* (2013.01); *F28F 21/084* (2013.01); *F28F 21/085* (2013.01); *F28F 21/086* (2013.01); *F28F 21/087* (2013.01); *H01L 23/3731* (2013.01); *H01L 23/3736* (2013.01); *H01L 23/3737* (2013.01)

(56) References Cited

U.S. PATENT DOCUMENTS

| | | | | |
|---|---|---|---|---|
| 2005/0019636 A1* | 1/2005 | Kwon | ................. | H01M 8/0232 429/457 |
| 2008/0135214 A1* | 6/2008 | Ohsawa | .............. | F28D 15/0233 165/104.27 |
| 2011/0174474 A1* | 7/2011 | Liu | ....................... | F28D 15/046 165/185 |
| 2012/0241133 A1* | 9/2012 | Yan | .................... | H05K 7/20309 165/104.26 |
| 2015/0289413 A1* | 10/2015 | Rush | ................. | H05K 7/20672 361/700 |
| 2018/0031330 A1* | 2/2018 | Roberts | ................. | F28D 15/046 |
| 2018/0265955 A1* | 9/2018 | Shimoda | ............... | C23C 28/023 |

FOREIGN PATENT DOCUMENTS

| | | |
|---|---|---|
| CN | 101348910 A | 1/2009 |
| CN | 101354221 A | 1/2009 |
| CN | 101354222 A | 1/2009 |
| CN | 101472450 A | 7/2009 |
| CN | 101520286 A | 9/2009 |
| CN | 101655328 A | 2/2010 |
| CN | 101762194 A | 6/2010 |
| CN | 101995182 A | 3/2011 |
| CN | 102378547 A | 3/2012 |
| CN | 103846366 A | 6/2014 |
| CN | 104053335 A | 9/2014 |
| CN | 206100771 U | 4/2017 |
| CN | 106653713 A | 5/2017 |
| CN | 107371322 A | 11/2017 |
| CN | 209693320 U | 11/2019 |
| TW | M399977 U | 3/2011 |
| TW | I427256 B | 2/2014 |
| TW | M498304 U | 4/2015 |
| TW | I582365 B | 5/2017 |
| TW | I582367 B | 5/2017 |
| TW | 200537067 A | 8/2017 |
| TW | 201728864 A | 8/2017 |
| TW | M577129 U | 4/2019 |

OTHER PUBLICATIONS

Search Report dated Oct. 17, 2019 issued by Taiwan Intellectual Property Office for counterpart application No. 107142119.

Search Report dated Jan. 8, 2020 issued by China National Intellectual Property Administration for counterpart application No. 2018114477279.

Search Report dated Feb. 21, 2021 issued by China National Intellectual Property Administration for counterpart application No. 2018114477279.

\* cited by examiner

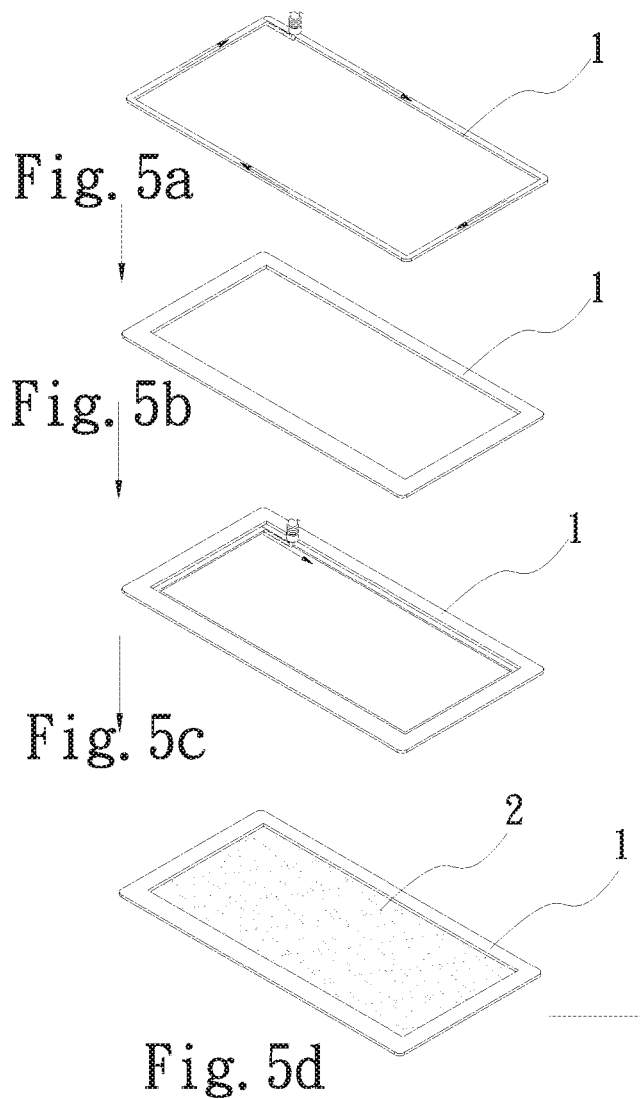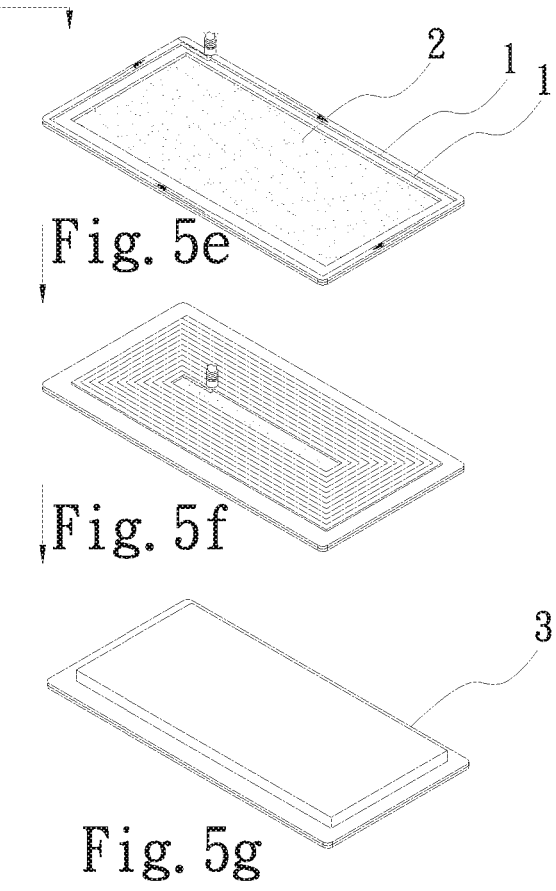

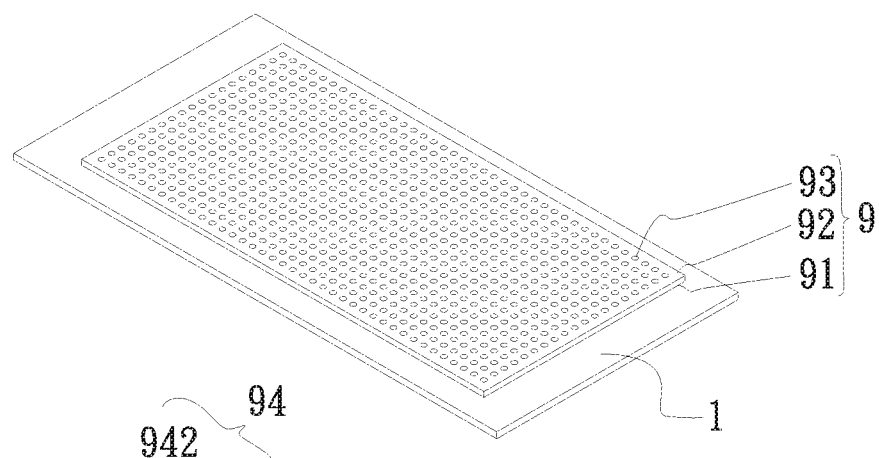
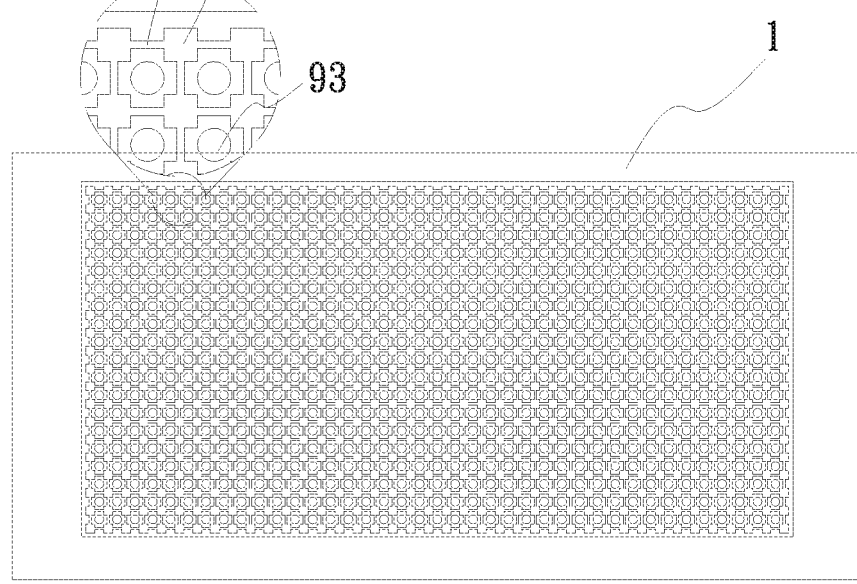
Fig. 9a
Fig. 9b
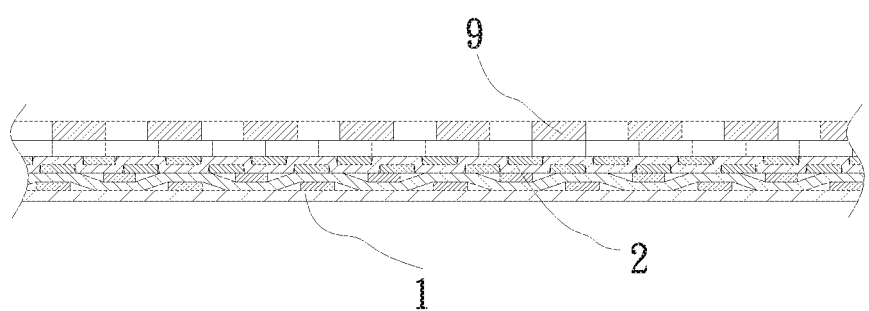
Fig. 9c

BASIC STRUCTURAL BODY FOR CONSTRUCTING HEAT DISSIPATION DEVICE AND HEAT DISSIPATION DEVICE

This application claims the priority benefit of U.S. provisional application No. 62/598,134 filed on Dec. 13, 2017.

FIELD OF THE INVENTION

The present invention relates to a basic structural body for constructing heat dissipation device and a heat dissipation device, and more particularly, to a basic structural body for constructing heat dissipation device and a heat dissipation device that has an integral structure formed layer by layer.

BACKGROUND OF THE INVENTION

The currently available electronic apparatus have constantly upgraded performance, and, as a result, heat produced by the electronic elements in the electronic apparatus, particularly the electronic elements for signal processing and data computation, is much higher than that produced by the electronic elements in the conventional electronic apparatus. There are various heat dissipation devices available for removing the produced heat from the electronic elements. Among others, heat pipes, heat radiators and vapor chambers are the most frequently used heat dissipation devices, because they are in direct contact with the heat-producing electronic elements to provide further enhanced heat dissipation effect and effectively prevent the electronic elements from being burned out due to overheat.

Vapor chamber, heat pipe, and loop heat pipe are the most commonly used heat dissipation devices, all of which internally define a vacuum-tight chamber, in which vapor-liquid circulation of a working fluid occurs with the aid of a wick structure provided in the chamber, so as to achieve a heat transfer effect.

More specifically, either the vapor chamber or the heat pipe achieves a heat exchange effect when the working fluid in the vacuum-tight chamber evaporates and condenses alternatively. Since the use of the heat pipe or the vapor chamber is largely restricted by the space in which the vapor chamber or the heat pipe is installed, most of the currently available heat pipes and vapor chambers are manufactured to nominal sizes with limited shapes and dimensions and are therefore relatively inflexible in use.

However, the conventional vapor chamber is formed by closing two plate members to each other and sealing joints between them, so that an airtight chamber is defined in the completed vapor chamber; and the conventional heat pipe has two sealed ends to internally define an airtight chamber. The airtight chamber of the vapor chamber and the heat pipe is then evacuated to produce a vacuum state therein and filled with a working fluid. In the process of manufacturing the vapor chamber and the heat pipe, a defective joint sealing procedure often leads to poor air-tightness and vacuum leakage of the completed vapor chamber and heat pipe. Further, edge portions/end portions reserved on the vapor chamber/the heat pipe for forming the sealed joints of the vapor chamber and the sealed ends of the heat pipe form ineffective zones that do not provide any space for the working fluid to work to therefore cause waste of material and increased manufacturing cost.

According to the conventional vapor chamber and heat pipe manufacturing method, different apparatus must be purchased for independently producing individual structural units for forming a complete vapor chamber and a heat pipe, such as the upper and lower plate members for the vapor chamber and the outer pipe for the heat pipe. Subsequent production can be started only after these individual structural units are produced. Further, at least one wick structure, such as a powder-sintered body, a woven mesh or a plurality of grooves, is to be provided in the airtight chamber of the vapor chamber and the heat pipe. In this case, at least one processing procedure, such as sintering, welding, diffusion bonding, knurling or laser processing, must be performed on the inner wall surfaces of the airtight chamber to provide the wick structure. In the case of a wick structure in the form of a woven mesh, it might not be easily tightly attached to the inner wall surfaces of the airtight chamber to therefore cause the problem of poor capillary force of the wick structure. Further, since the conventional vapor chamber is a structure formed of two superimposed plate members, its design and production is subjected to many restrictions and complicated manufacturing steps.

In summary, in the conventional vapor chamber and heat pipe manufacturing method, individual basic structural elements must be separately manufactured and then assembled together, or must be processed before being assembled together. However, inaccurate or defective assembling or sealing of these individual basic structural elements tends to cause poor joints or leaked airtight chamber and accordingly, defective products of vapor chambers and heat pipes.

It is therefore tried by the inventor to overcome the drawbacks of conventional heat dissipation devices.

SUMMARY OF THE INVENTION

A primary object of the present invention is to overcome the drawbacks of the conventional heat dissipation devices by providing a basic structural body for constructing heat dissipation device and a heat dissipation device that can be more flexibly designed while ensures absolute air tightness thereof.

To achieve the above and other objects, a first embodiment of the heat dissipation device provided according to the present invention includes a first basic structural body having a wick structure formed on one side surface thereof, and the first basic structural body and the wick structure are integral structural bodies formed layer by layer.

To achieve the above and other objects, a second embodiment of the heat dissipation device provided according to the present invention includes a plurality of first basic structural bodies respectively having a wick structure formed on one side surface thereof, and the first basic structural bodies and the wick structures are structures formed layer by layer. The first basic structural bodies are fixedly closed together in pairs to construct a desired heat dissipation device that internally defines an airtight chamber, and a working fluid is filled in the airtight chamber.

The first basic structural body and the wick structure can be formed using gold, silver, copper, aluminum, titanium, stainless steel, ceramic, non-metal materials, or any combination thereof.

Since the heat dissipation device according to the present invention is formed layer by layer in a special manufacturing manner, it can be more flexibly designed. The flexibly designed heat dissipation device of the present invention not only solves the disadvantages in the conventional heat dissipation devices caused by the joint sealing process, but also largely reduces the procedures and time needed in manufacturing the conventional heat dissipation devices while enables firm attachment of the wick structure to the inner wall surfaces of the heat dissipation devices. In summary, the present invention enables upgraded overall flexibility in designing and manufacturing a heat dissipation device.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein

FIGS. 5a to 5g are perspective views showing the forming of a fifth embodiment of the heat dissipation device according to the present invention;

FIG. 9a is a perspective view of a ninth embodiment of the heat dissipation device according to the present invention;

FIG. 9b is a top view of the ninth embodiment of the heat dissipation device according to the present invention;

FIG. 9c is a sectional side view of a first variation of the ninth embodiment of the heat dissipation device according to the present invention;

DETAILED DESCRIPTION OF THE PREFERRED EMBODIMENTS

Figure 1A:
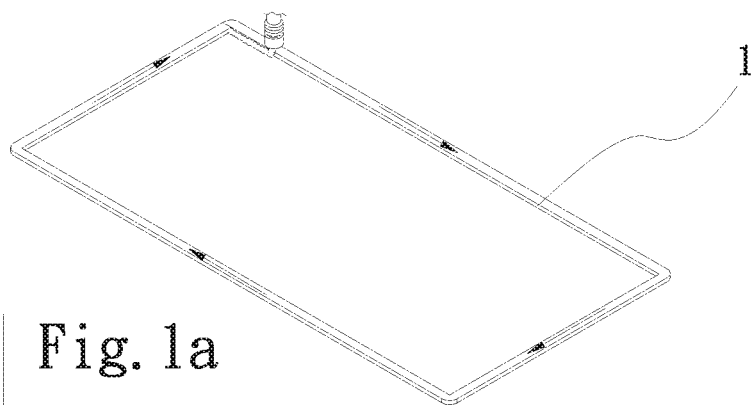
FIGS. 1a to 1d are perspective views showing the forming of a first embodiment of a heat dissipation device according to the present invention.

The present invention will now be described with some preferred embodiments thereof and by reference to the accompanying drawings. For the purpose of easy to understand, elements that are the same in the preferred embodiments are denoted by the same reference numerals.

The present invention provides a heat dissipation device having an integral structure constructed layer by layer or part by part based on the concept of creating something from zero. This type of manufacturing is implemented mainly through 3D printing, electrochemical processing, printing, thermal spraying, or any combination thereof. For this purpose, a primary fundamental carrier or member is first formed, and other secondary structural parts or structural bodies are then sequentially formed on the primary fundamental carrier or member lay by layer to finally form an integral structure.

Please refer to FIGS. 1a to 1d, which are perspective views showing the forming of a first embodiment of the heat dissipation device according to the present invention. In the first embodiment, a member serving as the primary fundamental carrier/member is a lower plate member of a vapor chamber, which is referred to as a/the first basic structural body and generally denoted by reference numeral 1 herein. There is a wick structure 2 formed on one side surface of the first basic structural body 1. The first basic structural body 1 and the wick structure 2 are structural bodies formed layer by layer.

Figure 1B:
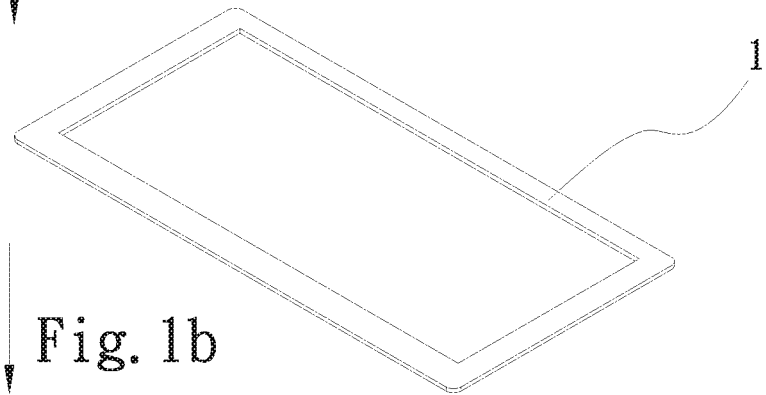

Please refer to FIG. 1a. The first basic structural body 1 is a structure formed layer by layer. Forming the structure layer by layer can be achieved through 3D printing, electrochemical processing, printing or thermal spraying. In the first embodiment, the first basic structural body 1 is illustratively and non-restrictively formed layer by layer through 3D printing. Further, the first basic structural body 1 can be formed of a metal material, a non-metal material, or a combination thereof. In the case of the metal material, it can be gold, silver, copper, aluminum, titanium, stainless steel, or an alloy thereof. In the case of the non-metal material, it can be plastic or ceramic. The finally formed first basic structural body 1 is shown in FIG. 1b. Further, the first basic structural body 1 can include a grooved structure (not shown) directly formed on an inner side surface that is to serve as an inner wall surface of the vapor chamber.

Figure 1C:
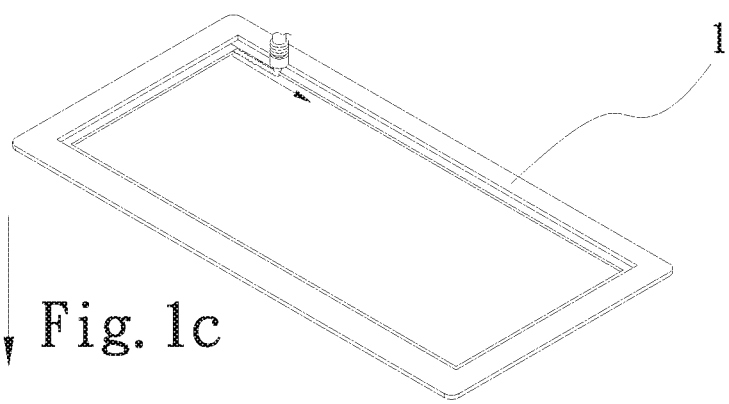

Please refer to FIG. 1c. The wick structure 2 is formed on the inner side surface of the first basic structural body 1 layer by layer, too. More specifically, the wick structure 2 can be a structural layer consisting of one single porous body or a structural layer consisting of a plurality of superimposed porous bodies achieved through any one of 3D printing, electrochemical processing, printing, and thermal spraying. The porous body can be a powder-sintered body, a woven mesh, a fibrous member, or a structural body combining superimposed layers of powder-sintered body, woven mesh and fibrous member.

Figure 1D:
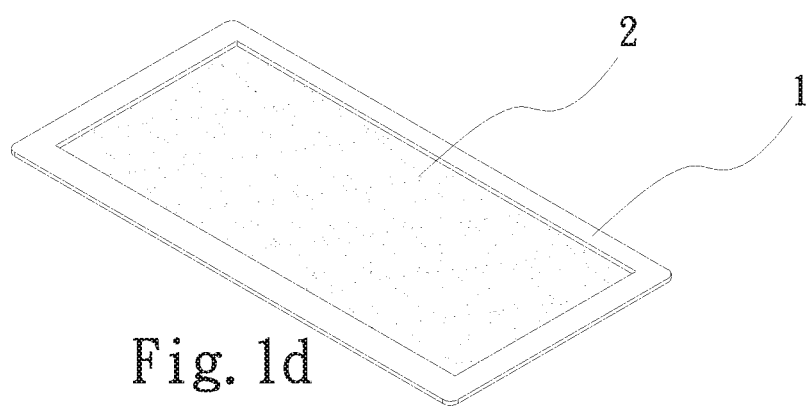

Please refer to FIG. 1d. After forming the first basic structural body 1 layer by layer and then forming the wick structure 2 on the first basic structural body 1 also layer by layer, a plate member for one side of the vapor chamber (i.e. a lower plate member or an upper plate member of the vapor chamber) is finally formed.

The titanium material for forming the first basic structural body 1 can be commercially pure titanium or a titanium alloy, both of which are characterized by the following nine advantages of high specific strength, good corrosion resistance, low elastic modulus, good heat resistance, good low-temperature performance, high biocompatibility, low heat transfer coefficient, colorful oxide film and being non-magnetic, and have been widely applied to livelihood-related industry, petrochemical industry, aerospace industry, military industry and medical industry. Up to date, there are already more than 100 types of titanium alloys that have been developed by different countries in the world, and about 40 to 50 types of these titanium alloys have already become commercialized. According to other chemical elements contained therein, these titanium alloys can be generally classified into three major categories, namely, alpha (α) alloys, alpha and beta (α-β) alloys, and beta (β) alloys. According to the types and contents of different chemical elements contained therein, alpha titanium alloys can be further classified into commercially pure titanium, alpha titanium alloys and near-alpha titanium alloys. Commercially pure titanium does not contain other chemical elements but only a trace amount of oxygen, carbon, nitrogen, hydrogen and iron. The oxygen in the pure titanium is an interstitial element, and the amount of oxygen contained in the pure titanium has a relatively big influence on the strength of the pure titanium. Generally speaking, the strength of titanium will increase 100~120 mPa (megapascal) when the content of oxygen in the titanium is increased by 0.1 wt %. According to the oxygen content thereof, the commercially pure titanium can be classified into four grades, namely, Grade 1 to Grade 4. The Grade 1 pure titanium has oxygen content lower than 0.18 wt % and the advantages of low strength, good ductility and good formability, and is primarily used as a material for roofing and plate-type heat exchanger. The Grade 2 pure titanium has a tensile strength ranged between 350 and 450 mPa, and is the most frequently used one among the four grades of pure titanium, mainly used in the manufacture of seamed or seamless pipes and chemical tanks and containers. The Grade 3 pure titanium has a strength ranged between 500 and 600 mPa and is mainly used in the manufacture of pressure chemical tanks and containers. The Grade 4 pure titanium has a strength close to 700 mPa and is the strongest one of the four grades of pure titanium, and is mainly used in the manufacture of some fasteners and relatively complicate parts that have to be formed around 300° C. Alpha titanium alloys contain alpha stabilizers, such as aluminum and oxygen, as well as neutral alloying elements, such as tin and zinc. Alpha titanium alloys having been subjected to annealing has a single-phase alpha structure that has good structural stability, heat resistance and weldability, as well as a metal strength higher than that of industrially pure titanium. To satisfy the requirement for strength, neutral elements are added to the alpha titanium alloys to increase their strength. A typical example of the strengthened alpha titanium alloys is Grade 6 titanium alloy, also known as Ti-5Al-2.5Sn, which has good fracture toughness and thermal strength at both room temperature and high temperature, and has a long-term working temperature about 500° C. Further, a low interstitial Ti-5Al-2.5Sn can be used in a low-temperature environment. As having been mentioned above, both the commercially pure titanium and the titanium alloys have the advantages of high specific strength, good corrosion resistance, low elastic modulus, good heat resistance, good low-temperature performance, high biocompatibility, low heat transfer coefficient, colorful oxide film and being non-magnetic. Therefore, different types of pure titanium or titanium alloys can be selected for manufacturing different portions of a loop heat pipe. That is, by using pure titanium and titanium alloys of different properties to replace the use of copper, aluminum or stainless steel that are conventionally used in the manufacture of loop heat pipes, it is able to advantageously largely upgrade the overall heat dissipation efficiency and structural strength of the loop heat pipes while largely reduce the overall weight thereof.

Figure 2A:
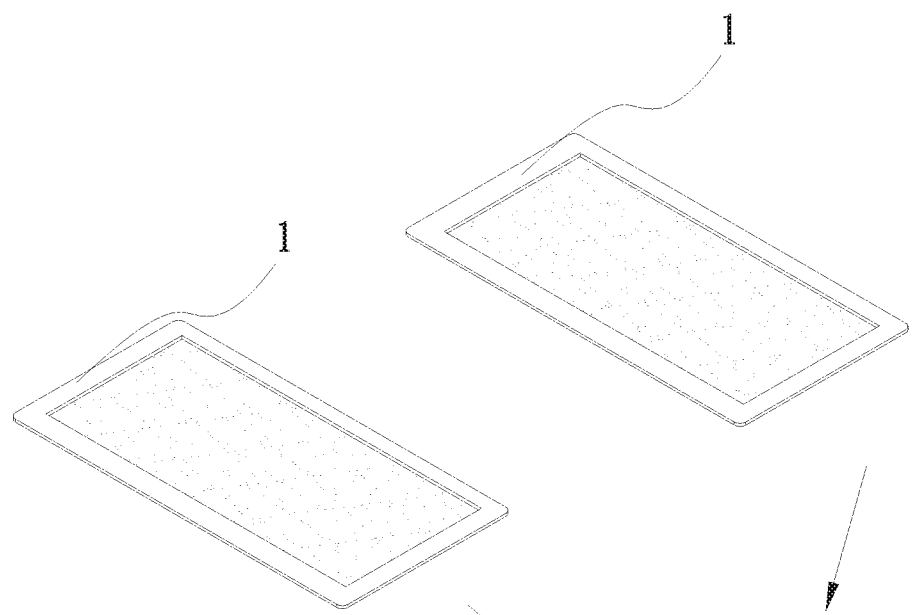
FIGS. 2a to 2c are perspective views showing the forming of a second embodiment of the heat dissipation device according to the present invention.
Figure 2B:
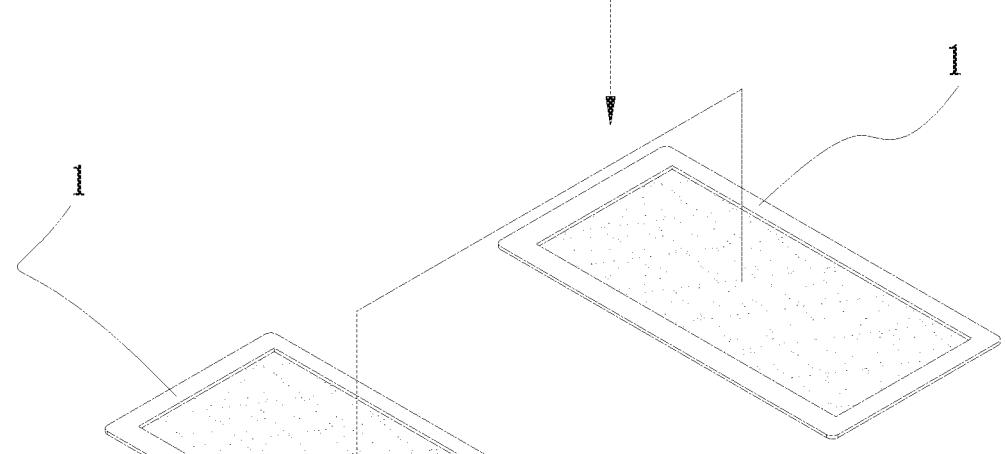
Figure 2C:
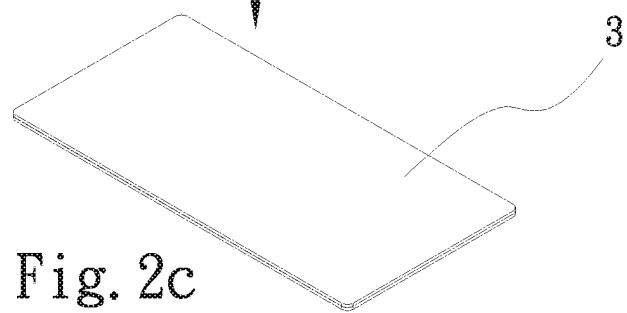
Figure 2D:
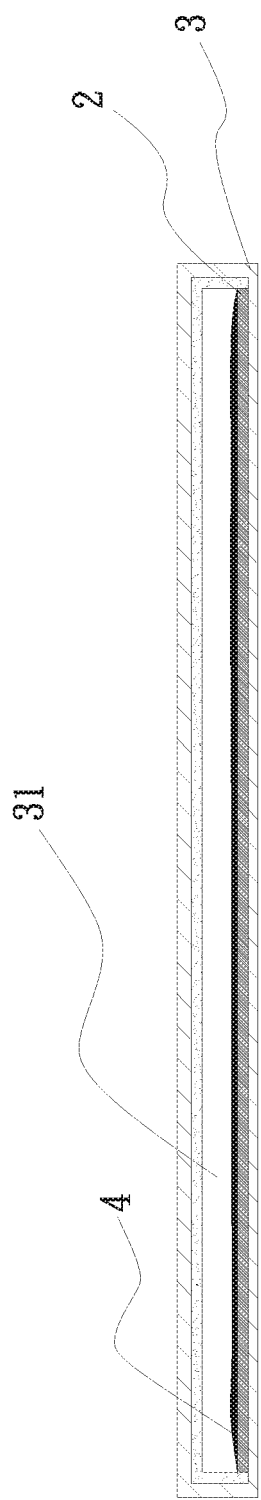
FIG. 2d is an assembled sectional view of the heat dissipation device of FIGS. 2a to 2c.

Please refer to FIGS. 2a to 2c, which are perspective views showing the forming of a second embodiment of the heat dissipation device according to the present invention; and to FIG. 2d, which is an assembled sectional view of the heat dissipation device of FIGS. 2a to 2c. Since the second embodiment is partially structurally similar to the first embodiment, portions of the second embodiment that are the same as the first embodiment are not repeatedly described herein.

The heat dissipation device in the second embodiment is generally denoted by reference numeral 3, and, as shown in FIG. 2a, is mainly manufactured using a plurality of first basic structural bodies 1, which are formed layer by layer as described in the first embodiment. As shown in FIG. 2b, two pieces of first basic structural bodies 1 are correspondingly closed together to construct a heat dissipation device 3, which is shown in FIG. 2c.

The heat dissipation device 3 constructed by correspondingly closing two pieces of first basic structural bodies 1 together internally defines an airtight chamber 31, in which a wick structure 2 and a working fluid 4 are provided.

Figure 3:
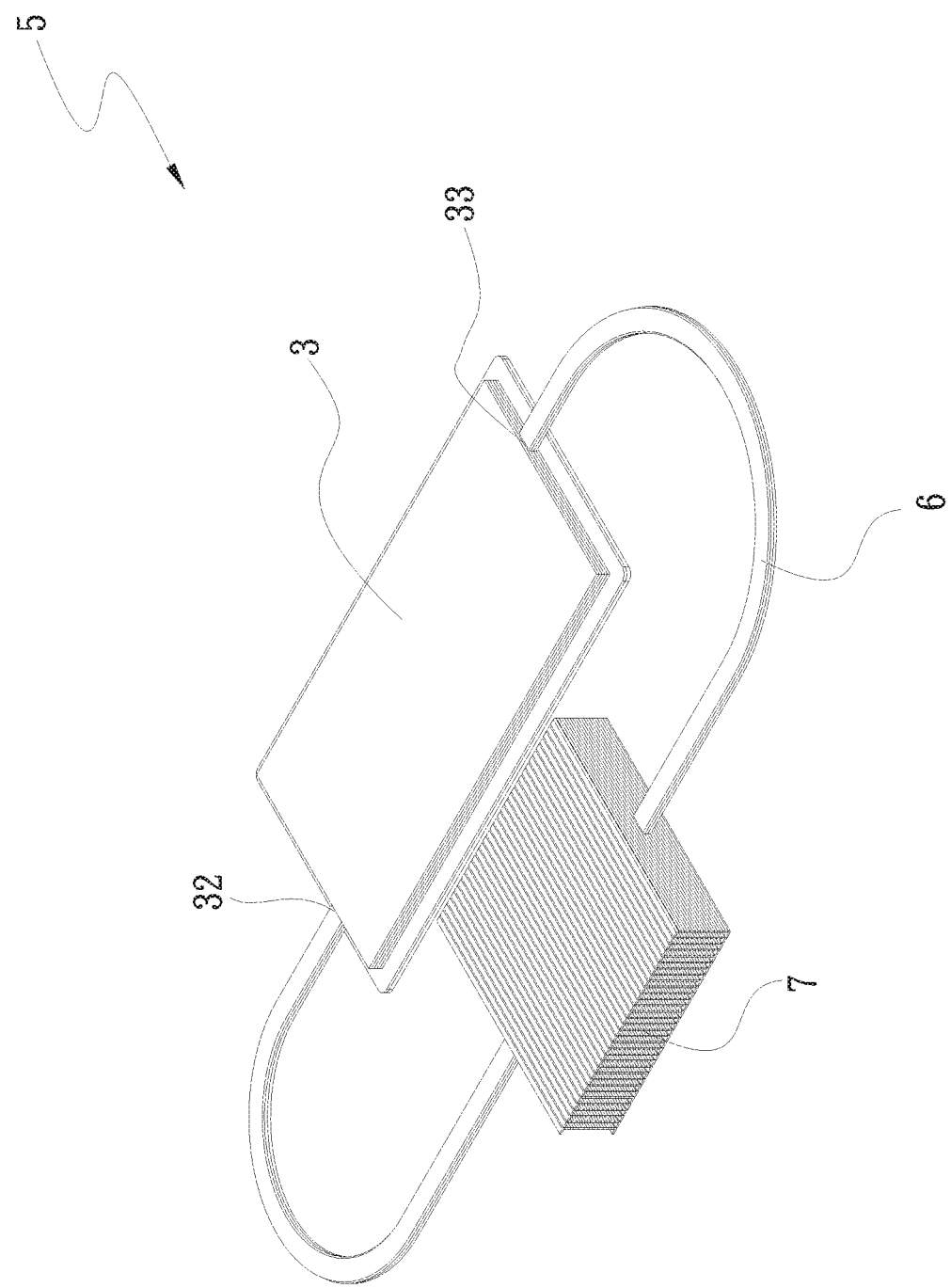
FIG. 3 is an assembled perspective view of a third embodiment of the heat dissipation device according to the present invention.

Please refer to FIG. 3, which is an assembled perspective view of a third embodiment of the heat dissipation device according to the present invention. Since the third embodiment is partially structurally similar to the second embodiment, portions of the third embodiment that are the same as the second embodiment are not repeatedly described herein. The heat dissipation device in the third embodiment is different from the second one in that it is embodied as a loop heat pipe 5. In the third embodiment, a vapor chamber is a member serving as a primary fundamental carrier for forming the loop heat pipe 5 and is referred to as a/the heat dissipation device 3 herein. The heat dissipation device 3 includes an outlet 32 and an inlet 33. A vapor and liquid pipe 6 is extended through a heat dissipation unit 7 and connected at two opposite ends to the outlet 32 and the inlet 33. The vapor and liquid line 6, the heat dissipation unit 7, and the heat dissipation device 3 are structures formed layer by layer through 3D printing. When forming the vapor and liquid line 6 layer by layer through 3D printing, different materials can be selected and used alternately.

Figure 4:
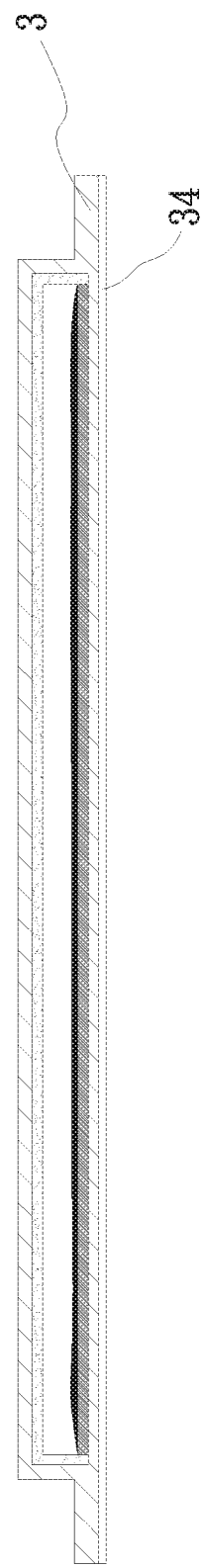
FIG. 4 is an assembled sectional view of a fourth embodiment of the heat dissipation device according to the present invention.

Please refer to FIG. 4, which is an assembled sectional view of a fourth embodiment of the heat dissipation device according to the present invention. Since the fourth embodiment is partially structurally similar to the second embodiment, portions of the fourth embodiment that are the same as the second embodiment are not repeatedly described herein. The heat dissipation device in the fourth embodiment is different from the second one in that it is externally provided on one side with a polymeric layer 34. The polymeric layer 34 can be formed using a natural polymer, a synthetic polymer or an inorganic polymer. The natural polymer can be any one of starch, rubber and nucleic acid. The synthetic polymer can be any one of polyethylene (PE), polyvinyl chloride (PVC), nylon, Dacron (polyethylene terephthalate or PET), acrylonitrile butadiene styrene (ABS), styrene-butadiene rubber (SBR), and other high-molecular polymers. The inorganic polymer can be any one of quartz, asbestos, mica and graphite. These polymers can give the heat dissipation device 3 additional structural properties.

Please refer to FIGS. 5a to 5g, which are perspective views showing the forming of a fifth embodiment of the heat dissipation device according to the present invention. Since the fifth embodiment is partially structurally similar to the first embodiment, portions of the fifth embodiment that are the same as the first embodiment are not repeatedly described herein. The heat dissipation device in the fifth embodiment is different from the first one in that it is a complete heat dissipation device 3 constructed layer by layer through 3D printing, electrochemical processing, injection, printing or thermal spraying. As shown in FIGS. 5a and 5b, a first basic structural body 1 (i.e. a lower plate member of a vapor chamber) is first formed through 3D printing. Then, as shown in FIG. 5c, a wick structure 2 is formed on one side surface of the first basic structural body 1 layer by layer through 3D printing. Finally, as shown in FIG. 5d, an integral structure including a first basic structure body 1 and a wick structure 2 is formed.

Please refer to FIG. 5e. Thereafter, any other remaining structural portion for constructing the desired heat dissipation device 3, such as an upper plate member of the vapor chamber, is formed on one side of the first basic structural body 1 over the wick structure 2 layer by layer through 3D printing. Meanwhile, an airtight chamber 31 (see FIG. 2b) is formed in the heat dissipation device 3, as shown in FIG. 5f. Finally, a complete heat dissipation device 3 is constructed, as shown in FIG. 5g.

Figure 6A:
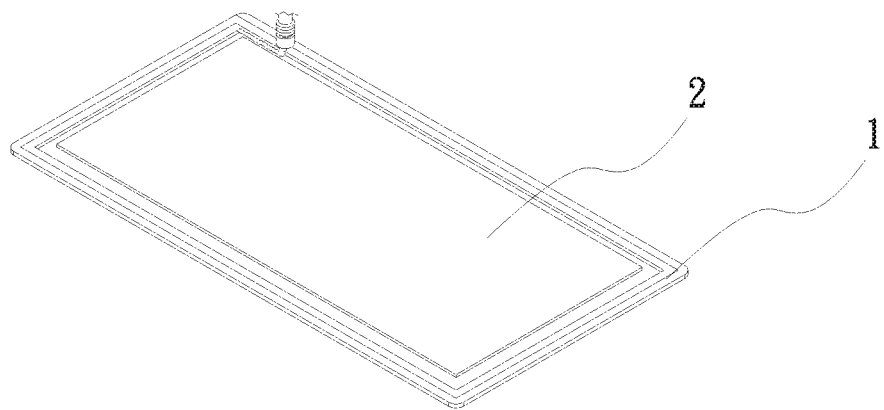
FIGS. 6a and 6b are perspective views showing the forming of a sixth embodiment of the heat dissipation device according to the present invention.
Figure 6B:
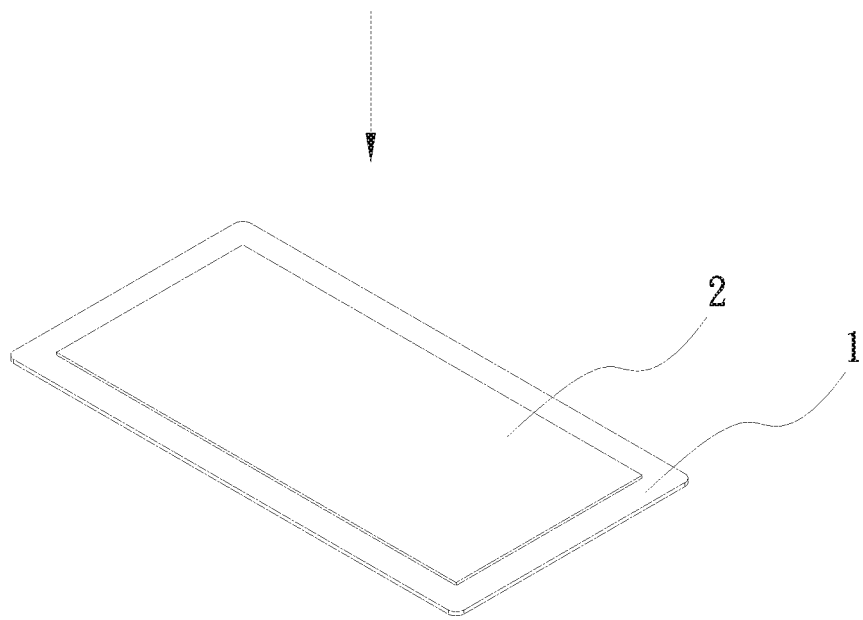

Please refer to FIGS. 6a and 6b, which are perspective views showing the forming of a sixth embodiment of the heat dissipation device according to the present invention. Since the sixth embodiment is partially structurally similar to the first embodiment, portions of the sixth embodiment that are the same as the first embodiment are not repeatedly described herein. The heat dissipation device in the sixth embodiment is different from the first one in that it is formed by first providing a pre-formed wick structure 2, as shown in FIG. 6a, and then forming layer by layer a first basic structural body 1 (such as an upper or a lower plate member of a vapor chamber) on at least one side of the wick structure 2, or forming a heat dissipation device 3 (such as a vapor chamber) on outer sides of the wick structure 2, as shown in FIG. 6b. The heat dissipation device 3 shown in FIG. 6b can be formed layer by layer through 3D printing or electrochemical processing.

Figure 7A:
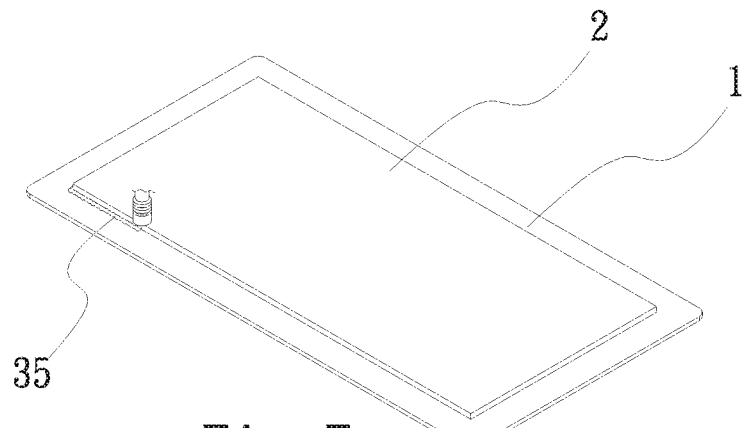
FIGS. 7a and 7b are perspective views showing the forming of a seventh embodiment of the heat dissipation device according to the present invention.
Figure 7B:
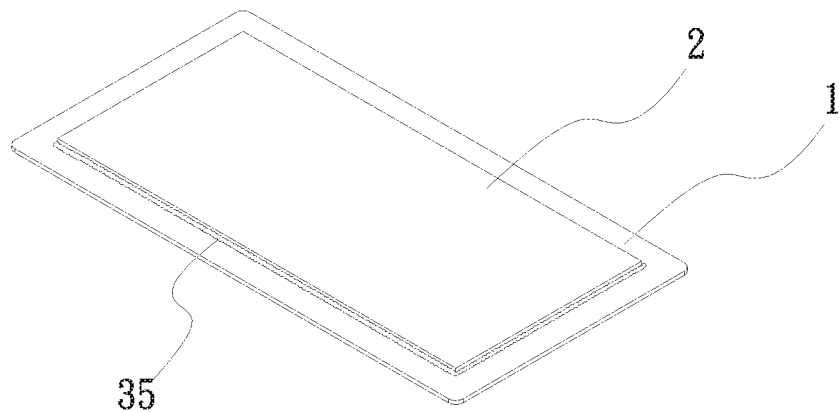

Please refer to FIGS. 7a and 7b, which are perspective views showing the forming of a seventh embodiment of the heat dissipation device according to the present invention. Since the seventh embodiment is partially structurally similar to the first embodiment, portions of the seventh embodiment that are the same as the first embodiment are not repeatedly described herein. The heat dissipation device in the seventh embodiment is different from the first one in that it is constructed by first forming a completed first basic structural body 1 and a completed wick structure 2, as shown in FIG. 7a, and then a bonding layer 35 is formed between the first basic structural body 1 and the wick structure 2, as shown in FIG. 7b. The bonding layer 35 can be formed through 3D printing, electrochemical processing, thermal spraying or printing. With the bonding layer 35, the first basic structural body 1 and the wick structure 2 are bonded to each other to form an integral body.

Figure 8:
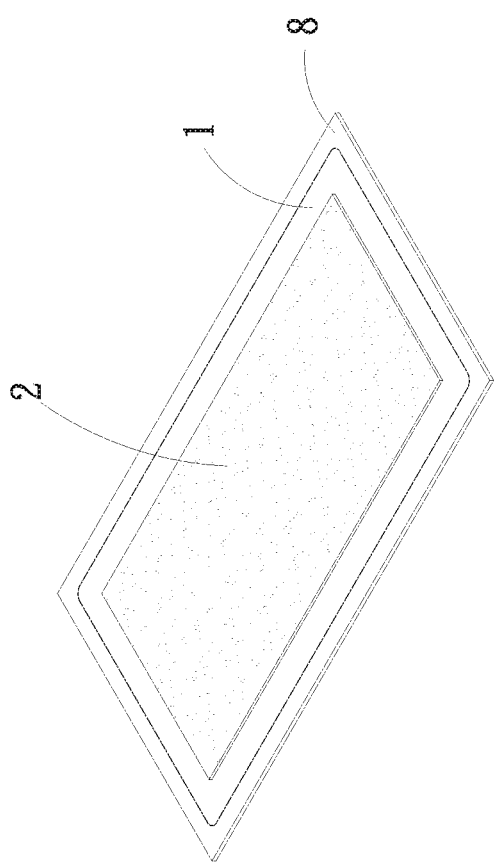
FIG. 8 is an assembled perspective view of an eighth embodiment of the heat dissipation device according to the present invention.

Please refer to FIG. 8, which is an assembled perspective view of an eighth embodiment of the heat dissipation device according to the present invention. Since the eighth embodiment is partially structurally similar to the first embodiment, portions of the eighth embodiment that are the same as the first embodiment are not repeatedly described herein. The heat dissipation device in the eighth embodiment is different from the first one in that it includes a first basic structural body 1 (i.e. a lower or an upper plate member of a vapor chamber) having a wick structure 2 formed on one side surface thereof through 3D printing, electrochemical processing, injection, printing or thermal spraying. Thereafter, a frame section 8 capable of upgrading other structural properties of the first basic structural body 1 is further formed along a right and a left edge, along an upper and a lower edge, or along all four edges of the first basic structural body 1 through 3D printing, electrochemical processing, injection, printing or thermal spraying.

The frame section 8 can be optionally formed of other materials showing different structural properties, so that the frame section 8 can give the first basic structural body 1 enhanced heat dissipation property or increased structural strength. For example, the frame section 8 can be otherwise formed of a titanium alloy having good shape memory property, an aluminum material having good heat dissipation property, a copper material having good heat absorption property, or graphite sheet or graphene having excellent temperature evenness effect without being limited to any particular material. Other materials can also be selected for forming the frame section 8.

Please refer to FIGS. 9a and 9b, which are perspective and top views, respectively, of a ninth embodiment of the heat dissipation device according to the present invention. Since the ninth embodiment is partially structurally similar to the fifth embodiment, portions of the ninth embodiment that are the same as the fifth embodiment are not repeatedly described herein. The heat dissipation device in the ninth embodiment is different from the fifth one in that it further includes an intermediate body 9 provided in the airtight chamber 31 defined in between two pieces of first basic structural bodies 1. In the ninth embodiment of the present invention, only the intermediate body 9 will be described. The intermediate body 9 and the first basic structural bodies 1 are integral structural bodies formed layer by layer.

The intermediate body 9 has a first side 91 and an opposite second side 92, and is provided with a plurality of through holes 93 and a recess structure 94. The recess structure 94 can be provided on any one or both of the first side 91 and the second side 92. In the illustrated ninth embodiment, the recess structure 94 is provided on the first side 91. The through holes 93 are extended through the intermediate body 9 to communicate the first side 91 with the second side 92. The recess structure 94 and the through holes 93 can be alternately arranged or not on the intermediate body 9. In the illustrated ninth embodiment, the recess structure 94 and the through holes 93 are alternately arranged on the intermediate body 9. However, it is understood the arrangement of the recess structure 94 and the through holes 93 in the ninth embodiment is only illustrative and not intended to limit the present invention in any way.

As can be seen in FIG. 9b, the recess structure 94 includes a plurality of spaced recesses 941, which are sunken from the first side 91 toward the second side 92. The through holes 93 and the recesses 941 can be horizontally staggered in any two adjacent rows or columns, or be vertically superimposed. In the illustrated ninth embodiment, the through holes 93 and the recesses 941 are horizontally staggered in any two adjacent rows or columns, i.e. each of the through holes 93 is located in an area between any two adjacent recesses 941. However, it is understood the arrangement of the recesses 94a and the through holes 93 in the ninth embodiment is only illustrative and not intended to limit the present invention in any way. At least one connecting path 942 is provided between two adjacent recesses 941 with two ends of the connecting path 942 serially connected to the recesses 941, such that the recesses 941 are communicable with one another in both a transverse and a longitudinal direction.

Please refer to FIG. 9c, which is a sectional side view of a first variation of the ninth embodiment of the heat dissipation device according to the present invention. As shown, in this first variation, the heat dissipation device includes a wick structure 2 provided between the first basic structural body 1 and the intermediate body 9. The wick structure 2 can be a structural layer consisting of one single porous body or a structural layer consisting of a plurality of superimposed porous bodies. The porous body can be a powder-sintered body, a woven mesh, a fibrous member, or a structural body combining superimposed layers of powder-sintered body, woven mesh and fibrous member. Alternatively, the porous body can include a plurality of grooves that are formed between mutually spaced ribs. In the illustrated first variation of the ninth embodiment, the porous body is a woven mesh. However, it is understood the porous body in the form of a woven mesh in the ninth embodiment is only illustrative and not intended to limit the present invention in any way.

Figure 9D:
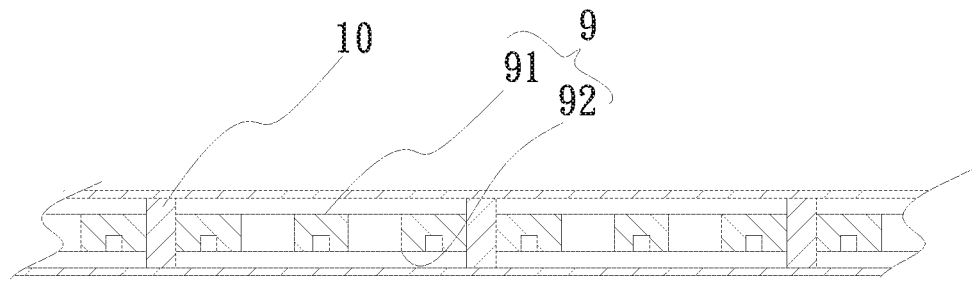
FIG. 9d is a sectional side view of a second variation of the ninth embodiment of the heat dissipation device according to the present invention.

Please refer to FIG. 9d, which is a sectional side view of a second variation of the ninth embodiment of the heat dissipation device according to the present invention. As shown, in this second variation, the intermediate body 9 further includes a plurality of supporting structures 10, each of which is in the form of a post having two ends extended through and projected from the first side 91 and the second side 92 of the intermediate body 9.

Figure 9E:
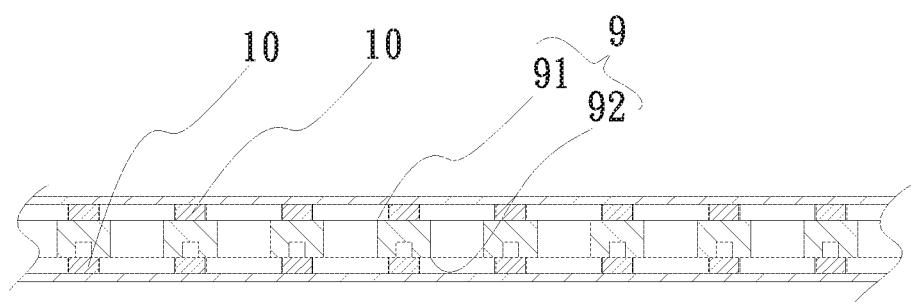
FIG. 9e is a sectional side view of a third variation of the ninth embodiment of the heat dissipation device according to the present invention.

Please refer to FIG. 9e, which is a sectional side view of a third variation of the ninth embodiment of the heat dissipation device according to the present invention. As shown, in this third variation, the intermediate body 9 further includes a plurality of supporting structures 10, each of which includes a plurality of posts separately located on the first side 91 and the second side 92 of the intermediate body 9.

Figure 10A:
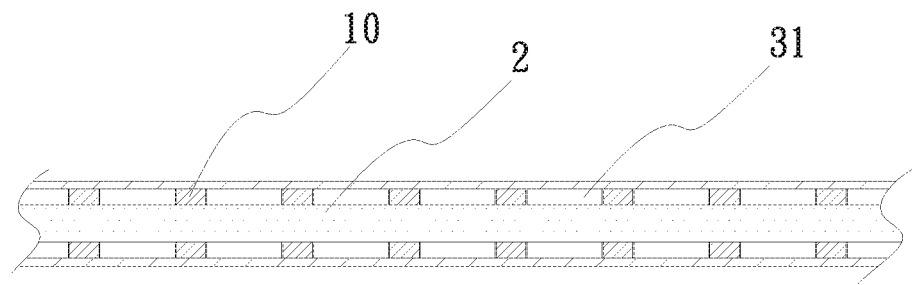
FIG. 10a is a sectional side view of a tenth embodiment of the heat dissipation device according to the present invention.
Figure 10B:
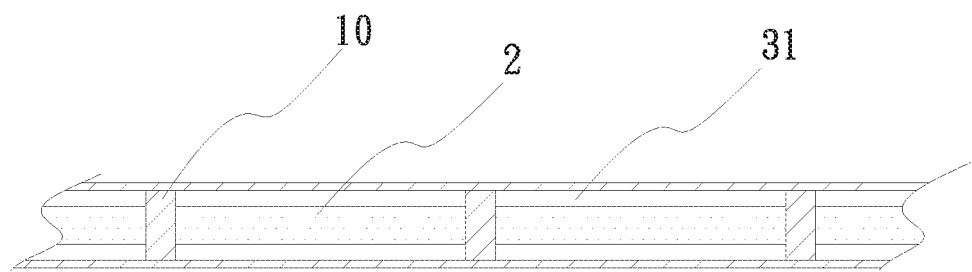
FIG. 10b is another sectional side view of the tenth embodiment of the heat dissipation device according to the present invention.

Please refer to FIGS. 10a and 10b, which are sectional side views of a tenth embodiment of the heat dissipation device according to the present invention. Since the tenth embodiment is partially structurally similar to the fifth embodiment, portions of the tenth embodiment that are the same as the fifth embodiment are not repeatedly described herein. The heat dissipation device in the tenth embodiment is different from the fifth one in that it further includes at least one supporting structure 10 located in the airtight chamber 31. The supporting structure 10 has at least one end pressed against an inner wall surface of the airtight chamber 31. Further, the supporting structure 10 is an integral structural body formed on the wick structure 2 layer by layer.

The supporting structure 10 in the tenth embodiment can be differently configured. As shown in FIG. 10a, the supporting structure 10 in a first configuration thereof consists of a plurality of posts separately projected from two opposite sides of the wick structure 2 to press against inner wall surfaces of the airtight chamber 31.

As shown in FIG. 10b, the supporting structure 10 in a second configuration thereof includes a single post that is extended through the wick structure 2 with two opposite ends pressed against inner wall surfaces of the airtight chamber 31.

In either configuration, the supporting structure 10 is formed along with the first basic structural bodies 1 layer by layer to construct an integral and complete heat dissipation device. In this manner, it is able to save the manufacturing cost that is required in the conventional heat dissipation device for additional forming and processing two different elements, i.e. the first basic structural bodies 1 and the supporting structure 10. Therefore, the heat dissipation device according to the present invention can be manufactured at less time and labor as well as reduced waste to largely lower the manufacturing cost thereof.

For the wick structure 2, the first basic structural body 1 and the supporting structure 10 that are not particularly described in some of the above-mentioned embodiments, they can be made of gold, silver, copper, aluminum, titanium, stainless steel, ceramic, plastic, or any combination thereof. In the present invention, the wick structure 2 is a structural layer consisting of one single porous body or a plurality of superimposed porous bodies. The porous body can be a powder-sintered body, a woven mesh, a fibrous member, or a structural body combining superimposed layers of powder-sintered body, woven mesh and fibrous member.

In summary, the present invention mainly provides a heat dissipation basic structural body or a heat dissipation device, such as a vapor chamber, which is constructed layer by layer to complete an integral structural body. More specifically, all the parts of the vapor chamber, including the external upper and lower plate members and the internal wick structure thereof, are sequentially formed layer by layer. Further, according to the present invention, materials of different properties are used and processed at the same time to embody a single structural body that presents more than one material property or characteristic, so that a desired heat dissipation device can be manufactured in a more flexible manner without being limited by mold design, which doubtlessly increases the entire manufacturing flexibility and reduces the manufacturing cost of the heat dissipation device.

The forming of an integral structural body of a desired heat dissipation device layer by layer as disclosed in the present invention breaks through the bottleneck in the conventional heat dissipation device manufacturing methods by using and processing materials of different properties, such as metal and non-metal materials, at the same time and enabling tight and flat attachment of the wick structure to the internal chamber of the heat dissipation device through easier and less complicate processing procedures. The heat dissipation device having an integral structural body constructed layer by layer according to the present invention can be more easily accomplished with simplified manufacturing procedures while provides upgraded heat dissipation performance and ensures the air-tightness of the internal chamber of the heat dissipation device.

In the case the heat dissipation device, i.e. the vapor chamber, constructed layer by layer according to the present invention is manufactured in a vacuum environment, the device can not only have improved air-tightness, but also be formed without the need of performing an evacuation process. In this manner, more time and labor costs can be saved, upgraded yield rate can be achieved, and internal vacuum tightness can be ensured in the vapor chamber manufacturing process.

What is claimed is:

1. A structural body for a heat dissipation device comprising a first structural body and a wick structure formed on one side surface of the first structural body layer by layer by thermal spraying, wherein the wick structure comprises a structural layer including one single porous body or a plurality of superimposed, stacked porous bodies and wherein each one or more porous body is a structural body combining superimposed layers of a powder-sintered body, woven mesh, and a fibrous member.

2. The structural body for a heat dissipation device as claimed in claim 1, wherein the first structural body is formed using a material selected from the group consisting of gold, silver, copper, aluminum, titanium, stainless steel, ceramic, plastic, and any combination thereof.

3. The structural body for a heat dissipation device as claimed in claim 1, wherein the wick structure is formed using a material selected from the group consisting of copper, aluminum, nickel, gold, silver, titanium, stainless steel, alloys, ceramic, plastic, and any combination thereof.

4. The structural body for a heat dissipation device as claimed in claim 1, wherein the first structural body is in the form of a plate member.

\* \* \* \* \*